US009992573B1

(12) United States Patent
Meyer et al.

(10) Patent No.: US 9,992,573 B1
(45) Date of Patent: Jun. 5, 2018

(54) PHASE INVERSION FILTER FOR CORRECTING LOW FREQUENCY PHASE DISTORTION IN A LOUDSPEAKER SYSTEM

(71) Applicant: Meyer Sound Laboratories, Incorporated, Berkeley, CA (US)

(72) Inventors: Perrin Meyer, Albany, CA (US); John D. Meyer, Berkeley, CA (US)

(73) Assignee: Meyer Sound Laboratories, Incorporated, Berkeley, CA (US)

( * ) Notice: Subject to any disclaimer, the term of this patent is extended or adjusted under 35 U.S.C. 154(b) by 152 days.

(21) Appl. No.: 14/525,898

(22) Filed: Oct. 28, 2014

Related U.S. Application Data

(60) Provisional application No. 61/896,899, filed on Oct. 29, 2013.

(51) Int. Cl.
*H03G 5/00* (2006.01)
*H04R 3/04* (2006.01)
*H04R 3/12* (2006.01)

(52) U.S. Cl.
CPC *H04R 3/04* (2013.01); *H04R 3/12* (2013.01)

(58) Field of Classification Search
CPC . H03G 5/005; H03G 5/16; H04R 3/14; H04R 3/00; H04R 5/02; H04R 29/007; H04R 3/04; G06F 17/30743; H03H 17/02; G10K 11/00; G10K 11/178
USPC .......... 381/55, 59, 103, 123, 77, 98; 700/94; 704/500, 226; 330/250, 75
See application file for complete search history.

(56) References Cited

U.S. PATENT DOCUMENTS

| | | | | |
|---|---|---|---|---|
| 4,524,423 A | 6/1985 | Acampora | | |
| 5,511,129 A * | 4/1996 | Craven | H03G 5/165 | 381/103 |
| 5,797,847 A | 8/1998 | Miller et al. | | |
| 6,377,035 B1 | 4/2002 | Jurisch | | |
| 6,504,935 B1 * | 1/2003 | Jackson | G10H 1/125 | 381/61 |
| 7,420,488 B2 | 9/2008 | Inoue et al. | | |
| 7,885,991 B2 | 2/2011 | Behrens et al. | | |
| 8,315,299 B2 | 11/2012 | Harikumar et al. | | |
| 2002/0046227 A1 * | 4/2002 | Goszewski | H03H 17/0223 | 708/313 |
| 2005/0013443 A1 * | 1/2005 | Marumoto | H03G 9/005 | 381/56 |

(Continued)

*Primary Examiner* — Vivian Chin
*Assistant Examiner* — Ubachukwu Odunukwe
(74) *Attorney, Agent, or Firm* — Beeson Skinner Beverly, LLP

(57) ABSTRACT

A filter for correcting phase distortion produced at low frequencies in a loudspeaker system is created by inverting the phase response of the determined complex-valued frequency response of a loudspeaker system. The inverted phase response is obtained by taking the complex conjugate of the phase response. The impulse response for the inverted phase response is obtained by means of an inverse Fourier transform of the inverted phase response. The impulse response provides a linear phase FIR filter having a long filter length. The linear phase FIR filter is applied to the audio signal input to the loudspeaker system. Prior to inverting the phase response, the determined complex-valued frequency response of a loudspeaker system can be subjected to high frequency blanking and polynomial smoothing. Also, the linear phase FIR filter can be subjected to a window function prior to applying the filter to the audio signal.

10 Claims, 7 Drawing Sheets

(56) References Cited

U.S. PATENT DOCUMENTS

| | | | | |
|---|---|---|---|---|
| 2008/0175422 | A1* | 7/2008 | Kates | G10H 1/125<br>381/316 |
| 2013/0058505 | A1* | 3/2013 | Munch | G10K 11/32<br>381/120 |
| 2013/0148822 | A1* | 6/2013 | Bithell | H04R 3/04<br>381/97 |

* cited by examiner

PHASE INVERSION FILTER FOR CORRECTING LOW FREQUENCY PHASE DISTORTION IN A LOUDSPEAKER SYSTEM

CROSS-REFERENCE TO RELATED APPLICATIONS

This application claims the benefit of U.S. Provisional Patent Application No. 61/896,899 filed Oct. 29, 2013, which is incorporated herein by reference.

BACKGROUND OF INVENTION

The present invention generally relates to systems and methods for correcting the frequency response of loudspeaker systems and more particularly relates to correcting phase distortion produced at low frequencies in loudspeaker system.

In many cases loudspeakers are perceived as having a particular tonal quality or sound, which is the result of the non-linear distortion in the loudspeaker's frequency response. One such example is a loudspeaker designed to impart a distinct sound to a guitar amplifier. In this case, non-linear distortion adds harmonic content or warmth, and diminished response at high frequencies prevents the guitar from sounding harsh. However, a loudspeaker meant to reproduce different sounds ideally should be linear and have a flat magnitude and phase response over its entire frequency range. Such an ideal loudspeaker can accurately reproduce any kind of audio signal without noticeable tonal effects.

Highly linear and accurate loudspeakers are often desired for particular applications, such as studio monitors used in film post production, CD mastering, and the like. Any non-linearity in a studio monitor will distort the audio output, a particularly undesirable result in a studio listening environment where decisions are made about the audio mix, microphone placement, et cetera, based on the audio output produced by the monitor.

A limitation in achieving accurate sound reproduction from studio monitors, and other full range loudspeakers, is phase distortion introduced at low frequencies. A medium or large scale studio monitor setup consists of 2-way or 3-way loudspeakers, where low frequencies (100-1000 Hz) are typically produced by a 12 inch cone moving coil transducer. To reproduce very low frequencies (<100 Hz) at loud levels, the system will also include a subwoofer, which typically consists of one or two 18 inch cone moving coil transducers. (In both cases, the cone material is usually made of paper, but could be fabricated of other materials such as carbon fiber or plastic.) Because the physics of all moving coil transducers are fundamentally similar—all are classical mass-spring systems—they act as high-pass systems. This low-frequency roll-off in the magnitude response also results in a phase shift or phase lag.

Due to this phenomenon, filters are often used to attain a flat magnitude response by boosting the low frequencies. The filters most often used for this purpose are $2^{nd}$ order biquadratic filters, or multiple biquads, cascaded together. While multiple biquads can be used to flatten the low frequency magnitude response of a loudspeaker, the resulting phase response is neither flat nor zero. With such filters, the cost for a flat low frequency magnitude response is low frequency phase distortion.

Headphones represent one way to overcome these physical limitations. Because they are worn close to the ears, they don't need substantial acoustic power to produce high sound pressure levels. As a result, the transducer (also a moving coil) can be very lightweight, which allows for a flatter magnitude response, and the transducer motion can be relatively small, which improves linearity. As a result, professional headphones are usually very linear and have a very flat frequency response. However, headphones do not provide an accurate stereo image and prevent easy interaction among studio professionals.

The present invention provides a filter that can correct the low frequency phase distortion inherent in loudspeakers with cone moving coil transducers. The filter of the invention also has a flat magnitude response. Thus, an almost ideal frequency response—flat in magnitude and zero in phase—can be produced across a loudspeaker's entire operating frequency range. While it is contemplated that the filter created in accordance with the invention would be implemented as a digital filter, it is not intended that the invention be limited to digital implementations.

SUMMARY OF INVENTION

The invention is directed to a method of creating a filter, most suitably a digital filter, which corrects low frequency phase distortion in a loudspeaker system with a transducer driven by a piston. The invention is further directed to a phase inversion filter created by such a method. In a first step of the method, the frequency response of the loudspeaker system is measured or obtained from mathematical models. The system frequency response is a complex-valued transfer function that includes magnitude and phase components at each frequency, called the magnitude response and the phase response, respectively. The frequencies (data points on the frequency scale) must be spaced close enough that the frequency response is a relatively high resolution representation of the loudspeaker system.

The high frequency cut-off can then be selected, above which the phase response of the loudspeaker system is substantially zero and below which it continuously moves away from zero. In order to reduce measurement noise at high frequencies, the phase response is set to zero, or blanked, above this cut-off.

To further reduce noise, the phase response can be smoothed. It may be advantageous to interpolate the phase response on a logarithmic frequency scale so that the information per octave is constant across the operating range of the system. A smoothing function can be fit to the phase, creating a polynomial approximation of the phase response.

This phase response can then be inverted by taking its complex conjugate. It is converted to a Finite Impulse Response (FIR) filter by an inverse Fourier transform. This impulse response in the time domain can then be modified to be symmetric, so that the coefficients with the largest values are in the center of the filter. The resulting FIR filter will be substantially linear phase.

Next, a symmetric window function can be applied to the FIR so that its coefficients decay to zero at both ends of the filter. Then, to correct the effects caused by the windowing operation, filters can be added to restore the frequency response to a flat response. The magnitude and phase responses can then be corrected down to a low frequency cut-off that is based on the operating range of the loudspeaker system, as determined from the system frequency response. The corrected, windowed, symmetric, substantially linear phase FIR filter can then be applied to the audio signal before being reproduced by the loudspeaker system. The loudspeaker system will have a flat frequency response and a phase response that is zero down to the low-frequency cut-off.

The method of the invention can be practiced without necessarily performing all of the foregoing steps. For example, after the frequency response of the of the loudspeaker system is determined, it can be decided whether further processing is required before inverting the phase and producing a FIR filter. Also, it is contemplated that the method might be practiced without applying a windowing function to the FIR filter.

DETAILED DESCRIPTION

Figure 1:
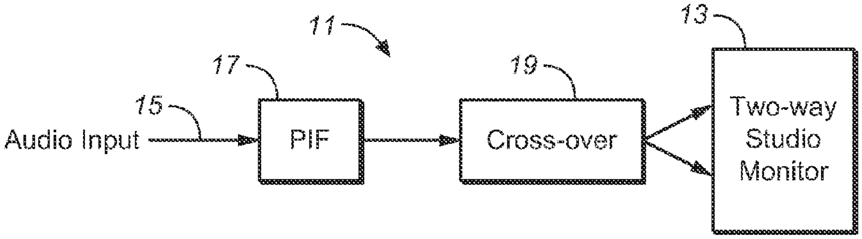
FIG. 1 is a block diagram of loudspeaker system using a phase inversion filter in accordance with the invention.

The present invention is directed to a filter and a method of creating a filter that compensates for low frequency phase distortion produced by loudspeaker systems, such as those used as studio monitors. The filter of the invention utilizes a unique phase inversion technique and will be referred to herein as a phase inversion filter, or PIF. Use of a PIF in a loudspeaker system is generally illustrated in FIG. 1 wherein a loudspeaker system, denoted by the numeral 11, is comprised of a two-way loudspeaker 13 driven by an audio signal input 15 through a PIF 17 and cross-over 19. The presence of the PIF in the signal input path for the audio input of the loudspeaker will result in a flat frequency response and a phase response that is zero down to the low frequency cut-off for the loudspeaker. The PIF is most practically a digital filter which could be applied to the audio content either in real time or offline; if the latter, the processed audio would be stored on a storage medium prior to playback. It will be appreciated that, while for illustrative purposes the PIF and cross-over are shown in a particular order and as discreet functional blocks, they could be implemented in a single functional block or in a different order.

Unlike conventional filter design for loudspeakers, the PIF is based on the theory of moving coil loudspeakers in general and a physical characterization of the loudspeaker system in particular. In accordance with the invention, a linear-phase, symmetric finite impulse response (FIR) filter is created that compensates for the system's inherent high-pass phase response.

The method of creating a phase inversion filter in accordance with the invention involves an ideal mathematical inversion and the manipulation of the initial mathematical model to obtain a usable filter design. The objective is to create a system response that has a flat magnitude response and a phase response that is zero over the system's operating range. The simplest way to create such an ideal system response is to calculate the inverse of the system's complete frequency response. Although formally correct, such a filter is useless in practice since it is almost certain to be unstable at 0 Hz (or DC): this instability would create auditory artifacts that would unduly compromise system performance.

For a real loudspeaker system with a finite bandwidth, which does not reproduce 0 Hz, the PIF filter must be limited to the operating bandwidth of the loudspeaker system. In this way, an ideal inversion can be realized over the operating bandwidth. For example, the PIF can be constructed to invert phase down to a low frequency cut-off of about 30 Hz. Thus, the filter compromises by enforcing a flat magnitude response at the price of letting the phase response return to the natural high-pass shape that is characteristic of mass-spring systems.

As is well understood in filter theory, the low frequency cut-off is constrained mathematically by the filter length: the lowest correctable frequency has a period roughly equivalent to the filter length. The filter length also determines the throughput latency of the filter, which is crucial if the filter is to be applied in real-time. For example, a symmetric FIR filter with 20,000 points (sometimes referred to as "taps") and a sampling rate of 100 kHz has a latency of 100 ms and can correct down to 5 Hz. The latency can be reduced by using a shorter filter, but this will raise the lowest possible cut-off frequency. In general, the PIF must be relatively long (16,000 points is typical), much longer than typically used in the professional audio industry. Depending on the frequency response of the system being corrected, a usable range of filter lengths is about 5,000 to 50,000 points. Filter lengths of 5,000 and 50,000 points have, respectively, a latency of 25 ms and 250 ms and a low frequency cut-off of approximately 20 and 2 Hz.

Figure 2:
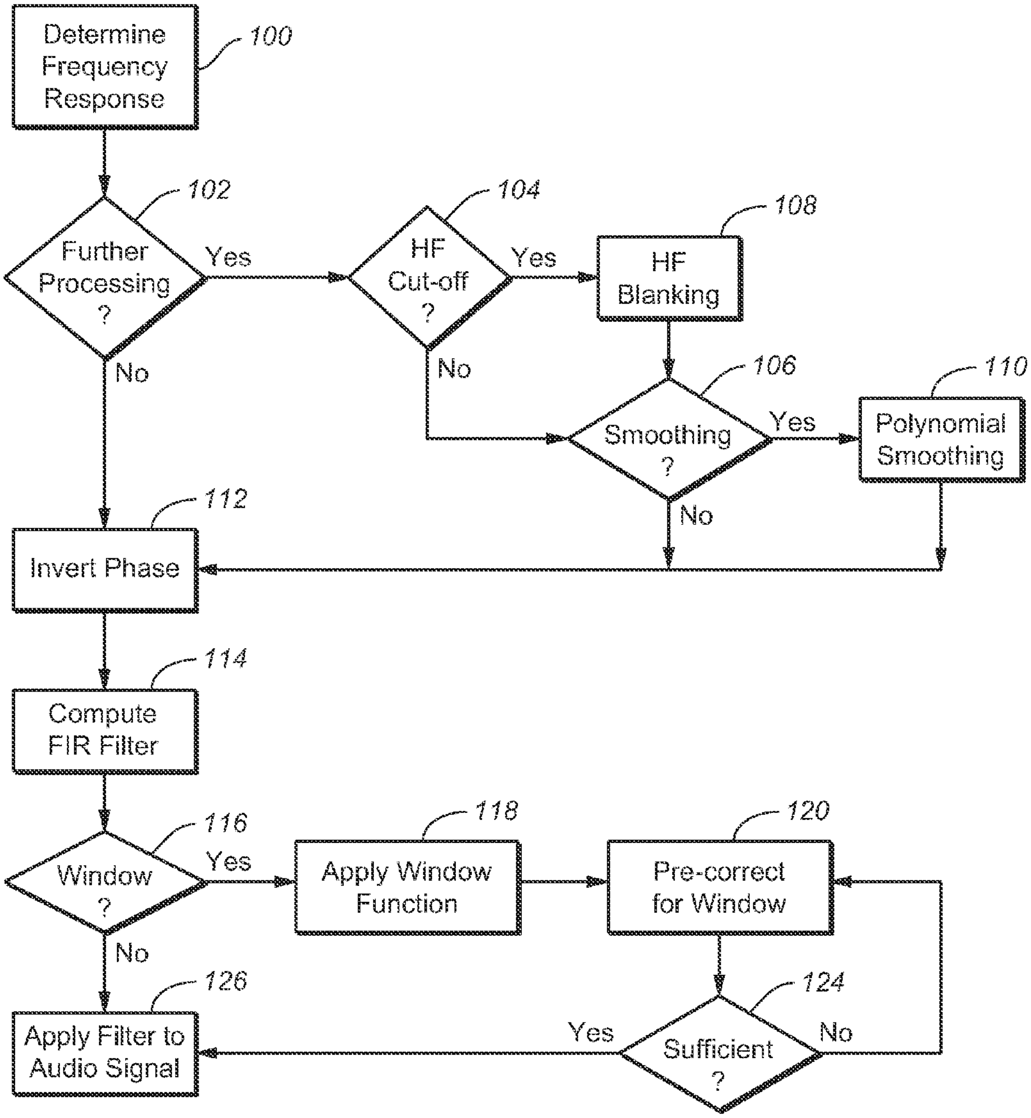
FIG. 2 is a block diagram illustrating steps for creating a phase inversion filter in accordance with the invention.

Steps for creating a PIF in accordance with the method of the invention are generally illustrated in FIG. 2. The starting point is to determine the frequency response of the loudspeaker system (block 100). After determining the initial frequency response, a need for further processing of the initial frequency response is assessed (block 102). The phase response can be further processed in several ways to improve the ability of the PIF filter to generalize to all spaces. The further processing can include assessing the need to apply high frequency cut-off and the need for polynomial smoothing (blocks 104 and 106). A high cut-off can be applied by applying high frequency blanking (block 108) and smoothing can be through polynomial smoothing techniques (block 110). The phase of determined frequency response, whether further processed or not, is then inverted (block 112) and the corresponding FIR filter is computed by an inverse Fourier transform (block 114). The need to apply a windowing function to the corresponding FIR filter is then assessed (block 116). The FIR filter can be processed by a windowing function (block 118), although any magnitude effects this produces must be corrected for (blocks 120, 124). In the last step, the resulting PIF is applied to the input audio signal and reproduced by the loudspeaker system (block 126).

The aspects of foregoing steps are now described in greater detail. The frequency response of the loudspeaker system can either be a single loudspeaker, for example, a loudspeaker having a 12 inch cone driver and a one inch compression driver, or a loudspeaker as described above plus a subwoofer with a crossover. The PIF method ideally requires that the loudspeaker or loudspeaker system have a flat magnitude response. However, it is understood that the PIF method can compensate for a non-flat magnitude as well.

Typically, the measurement of the loudspeaker or loudspeaker system is made under free field conditions, such as in an anechoic chamber or outdoors away from all objects. If the measurement is not free field, the PIF method will also invert the phase response contributed by the acoustic environment, creating a system valid only for that one environment. Such a measurement can be taken by a dual-channel FFT analyzer such as the SIM 3 audio analyzer, manufactured by Meyer Sound Laboratories, Incorporated of Berkeley, Calif. However, any measurement of the free-field frequency response will suffice as long as it has sufficient signal to noise and frequency resolution (greater than 24th octave).

Figure 3:
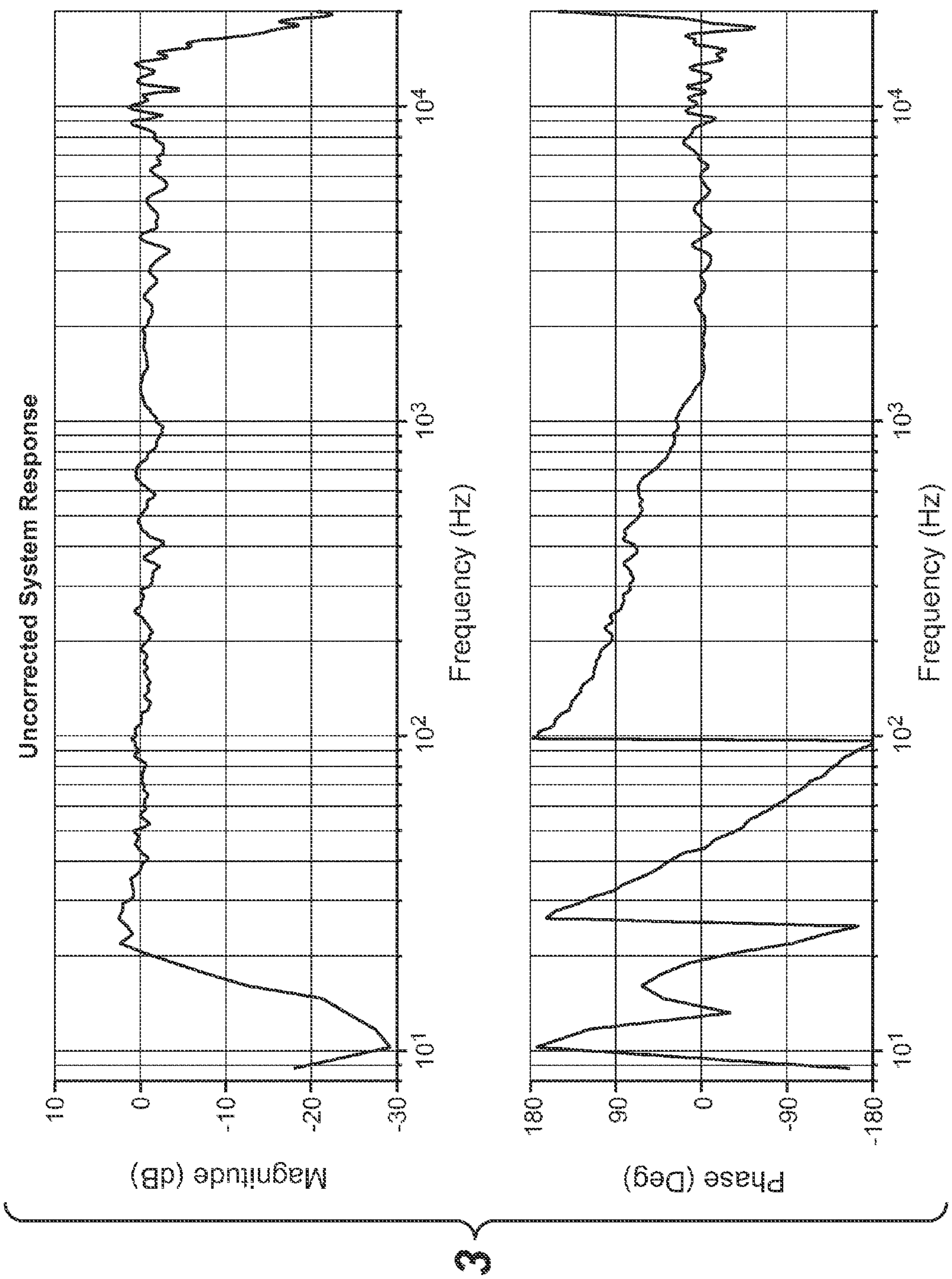
FIG. 3 provides graphs showing the measured anechoic frequency response of an exemplary three way loudspeaker system. The magnitude response is plotted on the top graph of FIG. 3 and the phase response is plotted on the bottom graph.

FIG. 3 shows an anechoic frequency response, measured with SIM, of an exemplary three way system manufactured by Meyer Sound. The system consists of an Acheron Designer, an X400 Subwoofer, and a Galileo 408 that uses $2^{nd}$ order elliptical high-pass and low-pass filters to create the crossover between the Acheron Designer and the subwoofer. The Acheron Designer is a two way studio monitor that has a 4 inch diaphragm compression driver for the high frequencies and a 12 inch paper cone moving coil loudspeaker for the low frequencies. The X400 subwoofer has a single 18 inch woofer. The combined system has a flat magnitude frequency response and a phase response that deviates from zero below 1.3 kHz.

Theoretically, the PIF could correct the phase over the entire operating bandwidth of the loudspeaker system, but there are practical reasons to avoid correcting the phase at higher frequencies. The small high frequency fluctuations in the phase trace at the bottom of FIG. 3 are effectively measurement noise. This is because no space is perfectly anechoic: at a minimum, the space used to measure the frequency response contains a microphone and a loudspeaker, if not also positioners and other equipment. All these objects reflect sound, particularly the high frequencies that have wavelengths comparable to the size of those objects. These ripples are different at each position, so correcting them at one measurement location makes them worse at another. Also, high frequency ripple also varies with temperature and humidity, which change over the course of hours. For these reasons, the PIF method may include an upper cut-off frequency above which the phase response is set to zero, or blanked, as represented by block 108 in FIG. 2. The result of high frequency blanking is shown in the phase response trace reproduced in FIG. 4, where the high frequency cut-off is at 1.3 kHz.

Figure 4:
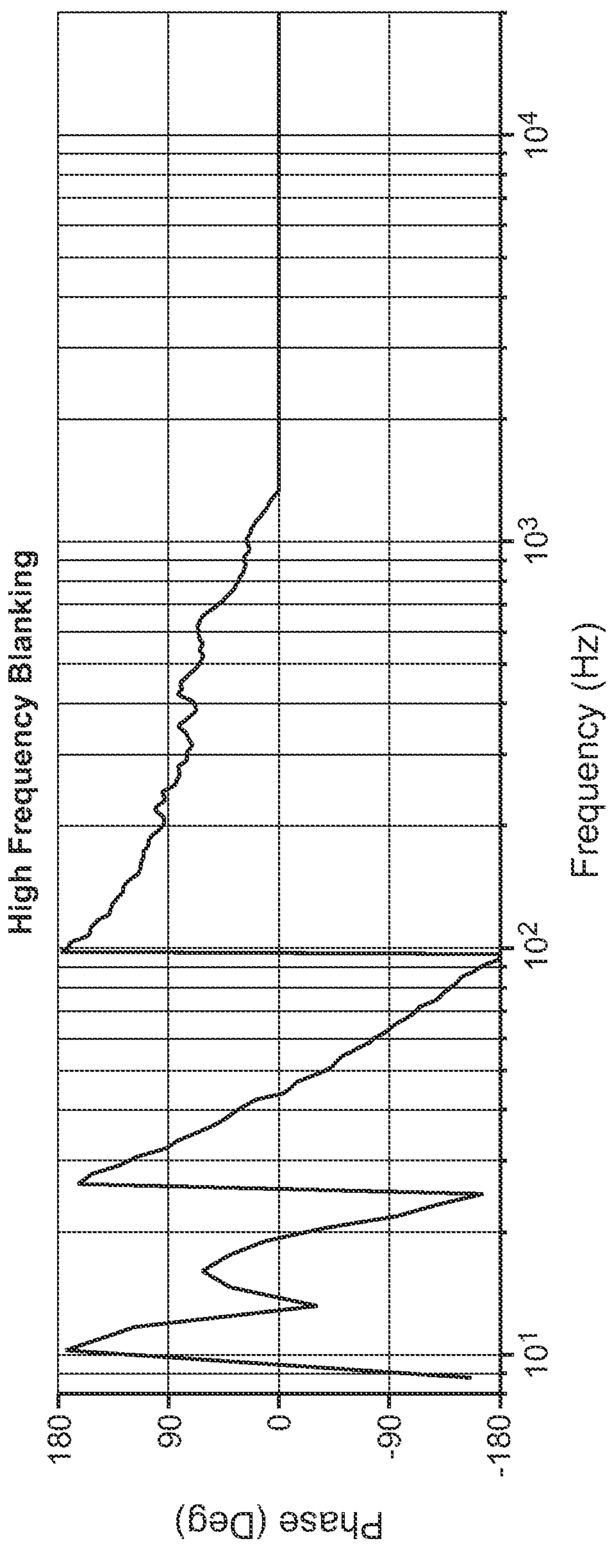
FIG. 4 is a phase versus frequency graph showing the effect of high frequency blanking above a frequency cutoff of 1.3 kHz.
Figure 5A:
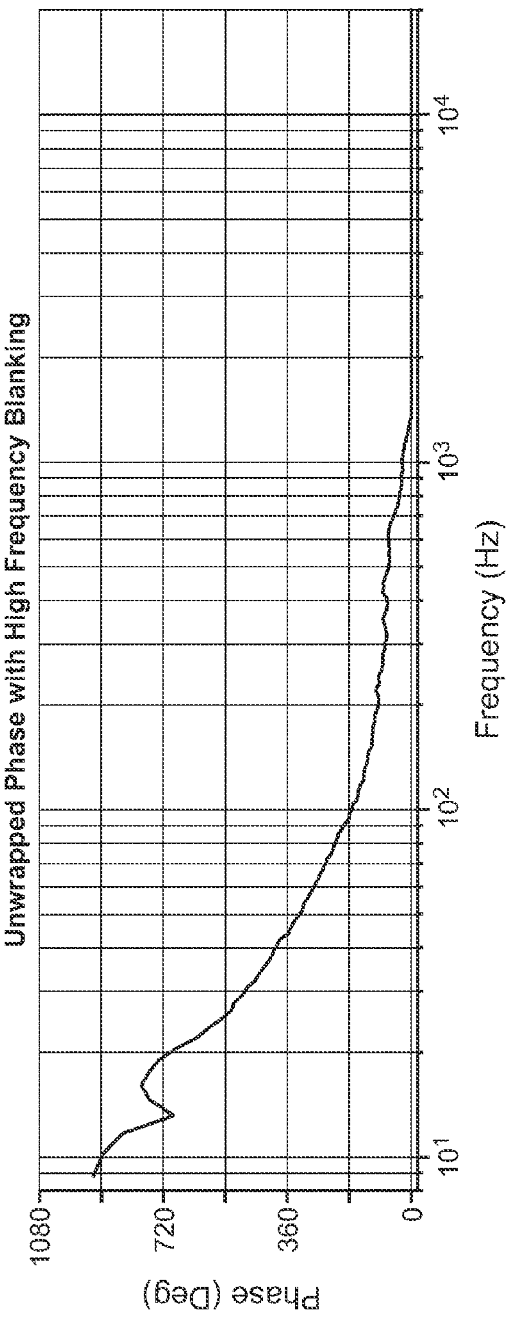
FIGS. 5A and 5B are phase versus frequency graphs showing the effect of phase unwrapping and of polynomial smoothing on the unwrapped phase trace. The unwrapped, high frequency blanked phase is shown in FIG. 5A and the smooth polynomial approximation is shown in FIG. 5B.

The PIF method may also include polynomial smoothing as a way to reduce noise in the phase response (blocks 106 and 110 of FIG. 2). Depending on the initial frequency resolution of the frequency response, the phase trace may need to be resampled so that the frequencies are logarithmically spaced. Logarithmic spacing allows standard curve-fitting routines, such as least-squared cubic splines, to provide consistent smoothing over all octaves and to prevent the smoothing polynomial from oscillating and creating a potentially unstable or distorted FIR filter. Before a smoothing algorithm can be applied, however, the phase must be unwrapped. Unwrapping removes the discontinuities when the phase changes from 180 to −180 (or vice versa) by adding or subtracting 360 degrees; this results in a curve which is continuous (in the mathematical sense) and has a continuous derivative. If the derivative is not continuous, the smoothing algorithm would produce a poor approximation of the phase with additional noise. In the example of FIG. 4, phase wraps can be seen at 24 Hz and 90 Hz. The unwrapped phase can be seen in FIG. 5A.

Figure 5B:
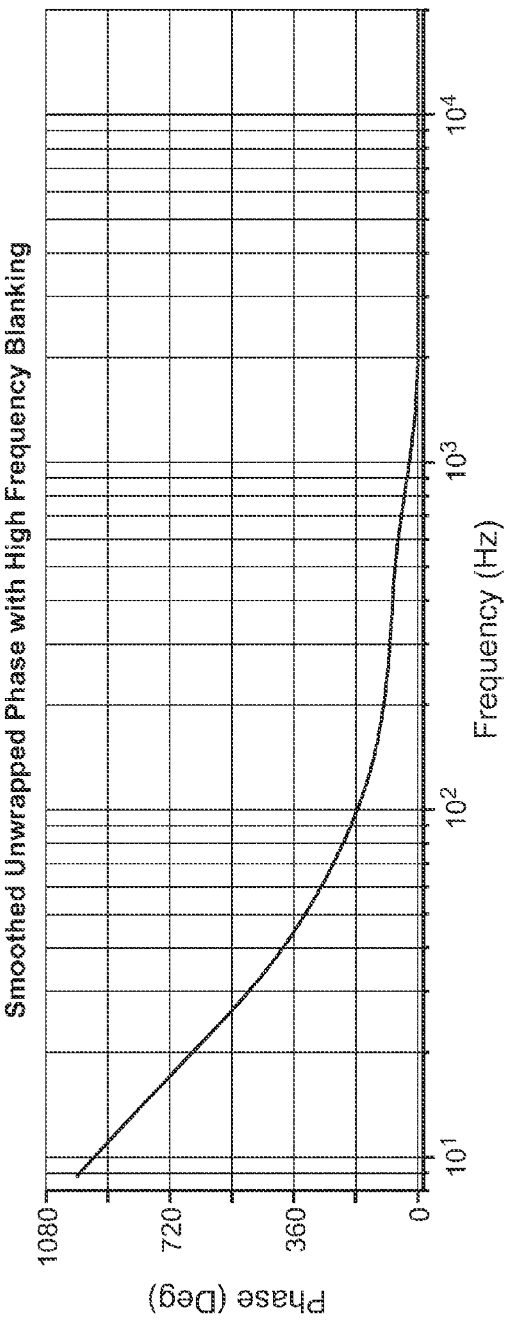

The unwrapped phase trace can then be smoothed to produce a smooth polynomial approximation to the phase. There are many ways to perform smoothing: the approximation shown in FIG. 5B was computed with a least-squares spline algorithm. Smoothing removes small magnitude, high order acoustic phenomena. This creates a PIF that only corrects for the large scale effects caused by the general physical principles already described, not for the small-scale, local effects that are valid at only one frequency or in only one position. As with frequency blanking, this removes artifacts in the frequency response measurement caused by acoustic reflections and diffractions.

The smooth phase approximation is inverted (block 112 in FIG. 2) by taking the complex conjugate of the complex representation of the phase. This is equivalent to multiplying by −1, or to reflecting the phase trace around the x-axis at 0 degrees.

Figure 6:
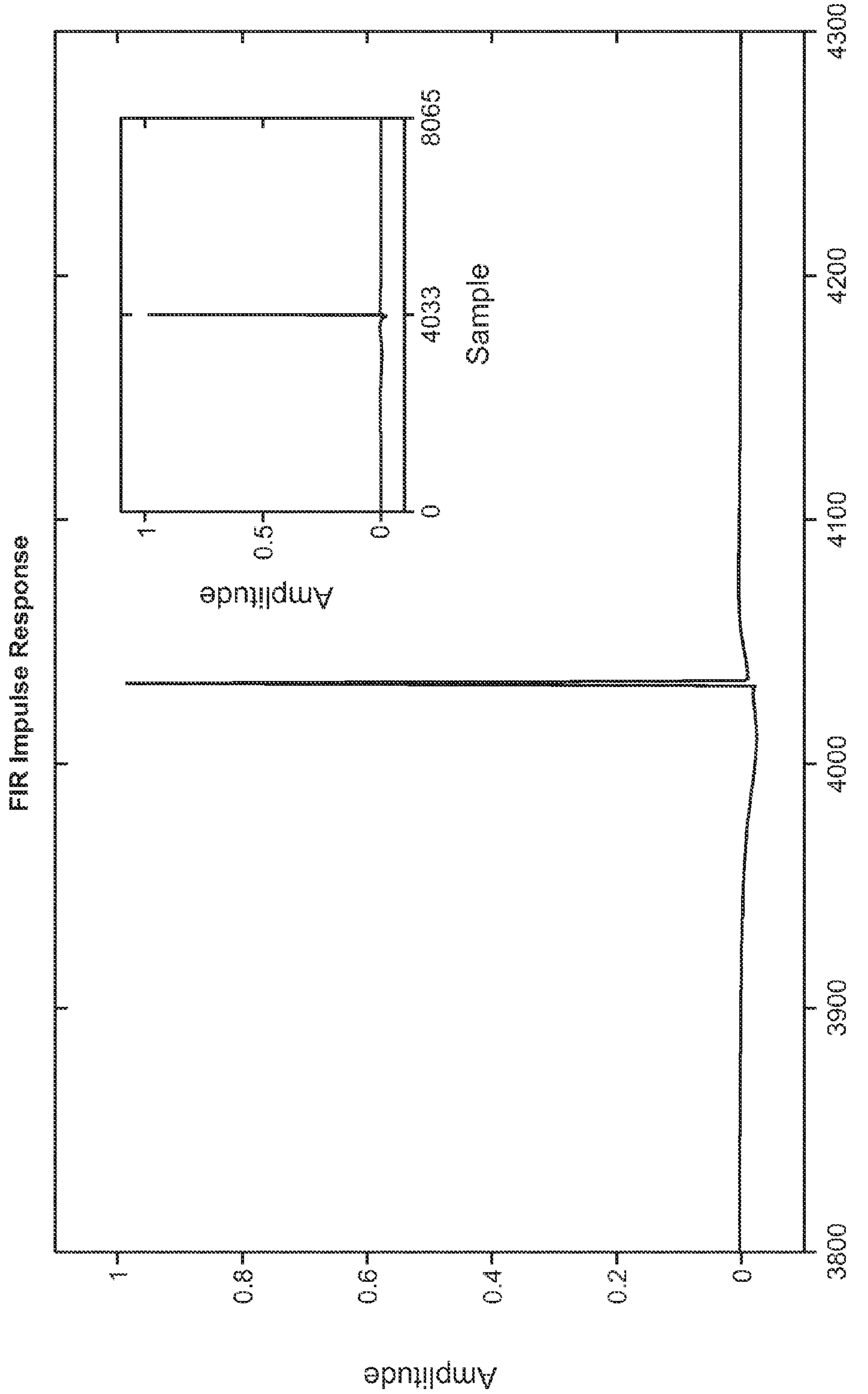
FIG. 6 is a graph showing the impulse response obtained from the polynomial approximation of the phase. A detail of the center of the filter is shown in the full graph, while the inset shows the full length of the filter.

A FIR filter, or a time domain impulse response, is then created by taking the inverse Fourier transform of the inverted phase. (FIG. 2, block 114) Because this filter corrects an arbitrary phase response, the FIR filter is not necessarily causal or symmetric. It is made into a linear phase filter, which is both causal and symmetric, by placing the peak value in the center of the filter, as shown in FIG. 6.

A linear phase FIR filter has now been produced. In order to remove audible distortions, particularly if the filter is to be used in real time, the FIR filter coefficients must decay to zero at both ends. This condition is enforced by applying a symmetric window function to the FIR coefficients. (FIG. 2, block 118.) The window can be a Kaiser window, which is a common windowing filter that contains a sidelobe attenuation parameter. In the case of high-fidelity audio, which has a dynamic range of 100 dB, the sidelobe attenuation can be chosen to be 100 dB. However, any symmetric bell shaped windowing function could be used, such as Hanning or Hamming windows, as long as its side lobe attenuation is acceptable.

Figure 7:
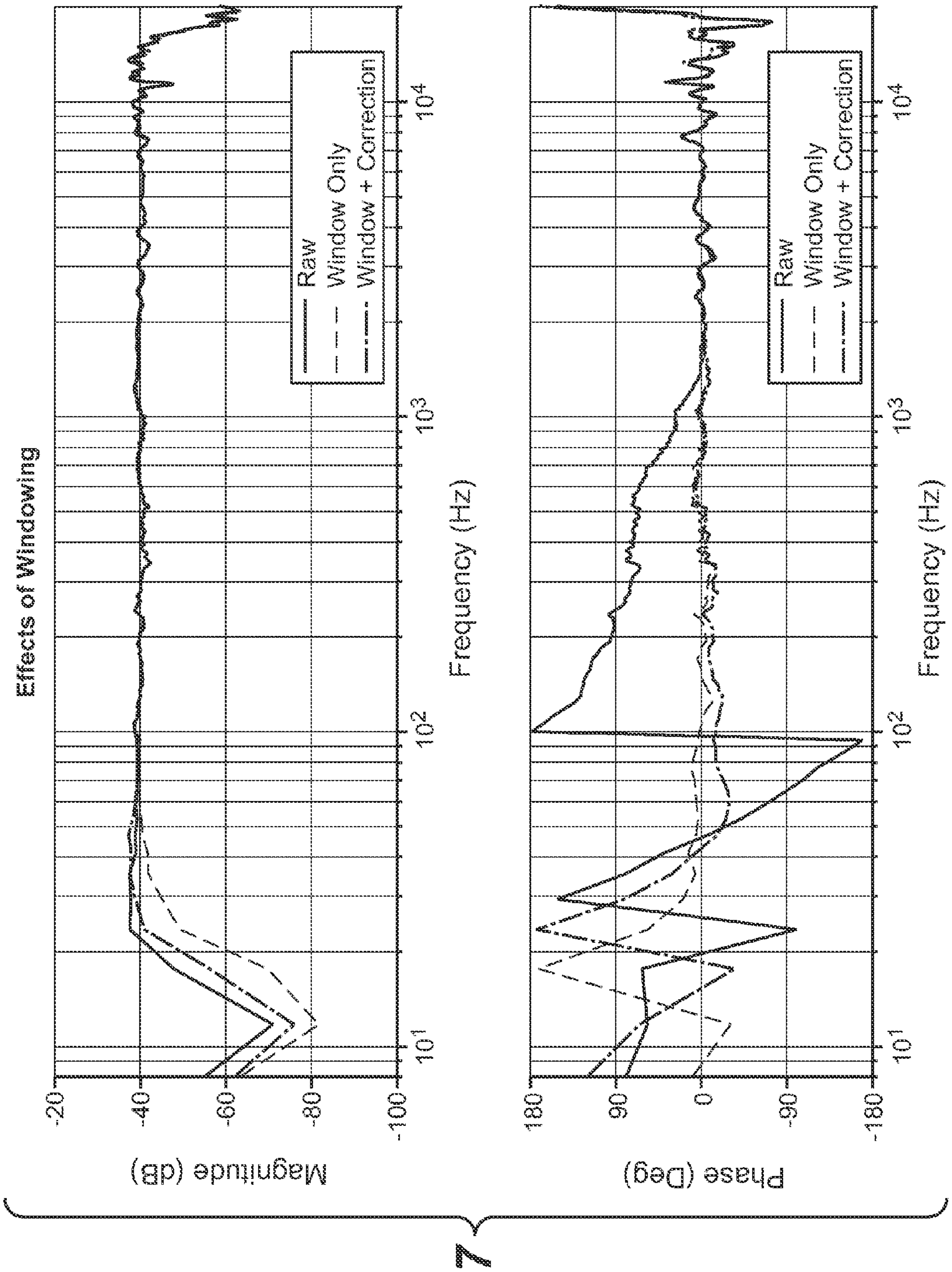
FIG. 7 are graphs showing the effect of the windowing function on magnitude (top graph) and phase (bottom graph) of the system frequency response. The raw system response is shown for comparison. The windowing function alone ("Window only") produces a magnitude drop below 30 Hz, which is corrected by a pre-distortion filter ("Window+ correction") down to 24 Hz.

As seen in FIG. 7, the above-described windowing has the undesirable side effect of changing the magnitude response of the PIF filter in a low frequency attenuation of the magnitude response. A small number of filters can be used to correct this, either by fitting them iteratively using acoustic measurements of the system under test, iteratively using a computational approach, or mathematically with a fitting algorithm such as a least-squared method. While the filters used to produce the effects shown in FIG. 7 are $2^{nd}$ order biquad IIR filters, other kinds of filters could be used as well. This is done until the low frequency region of the frequency response is flat to within some desired criterion and down to some low frequency cut-off point. The example in FIG. 7 has magnitude flat to within +/−2 dB and down to 23 Hz, and a phase of zero down to 40 Hz.

Figure 8:
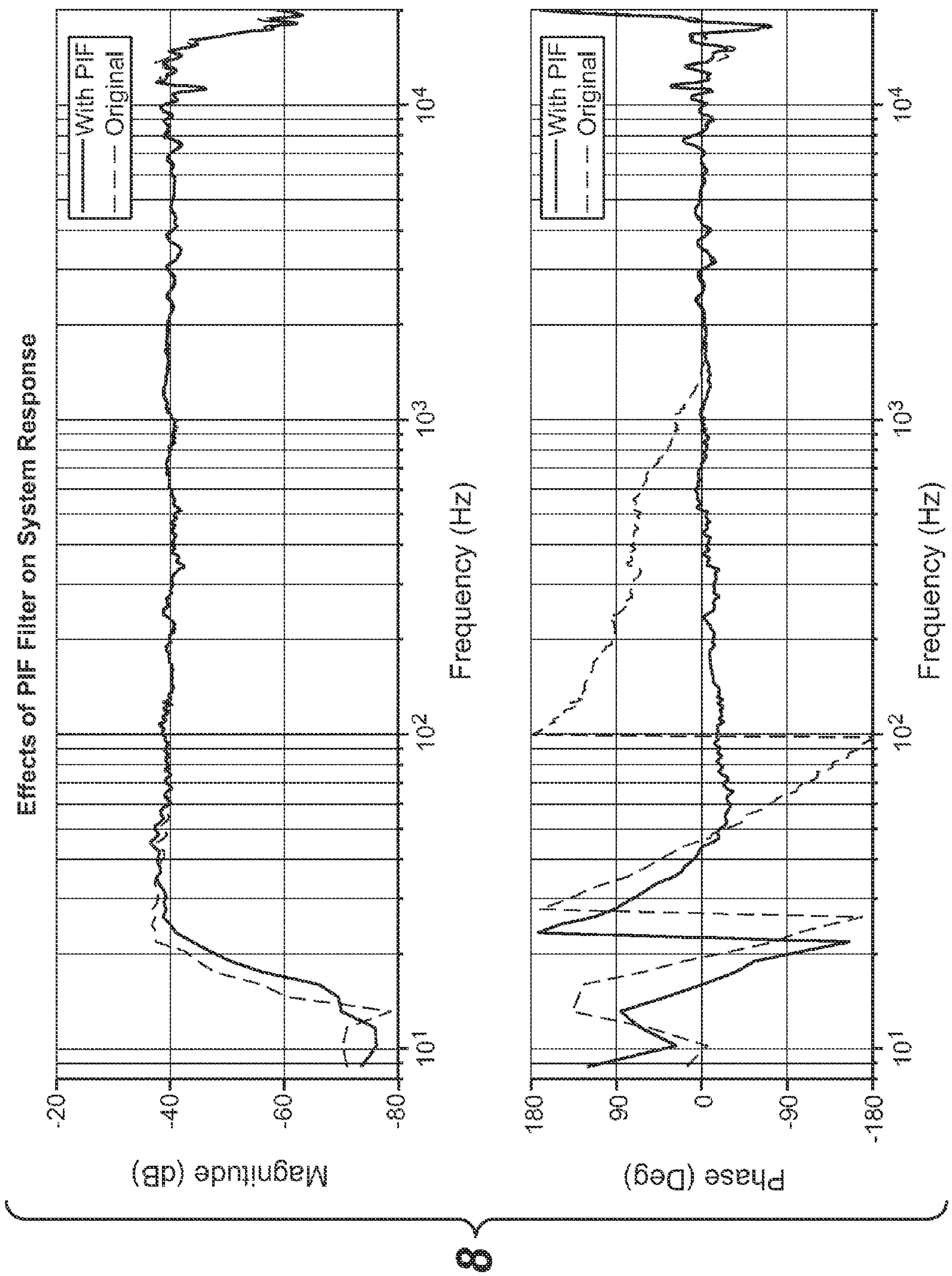
FIG. 8 compares the raw system response to the response obtained using the PIF filter and method.

FIG. 8 illustrates the effects that a PIF filter created in accordance with the method of the invention has on the system response of the selected loudspeaker system. The low frequency phase response of the original system had its first phase wrap at 100 Hz: the PIF system's first wrap is at 30 Hz, considerably lower. The magnitude trace is practically identical over the entire operating range. Note that the slight magnitude difference below 30 Hz, and the slightly negative phase at 40 Hz could be improved with further iterations of the window correction step.

It should be noted that the mathematical operations in this method could be performed in a different order and still produce a functional PIF. Many of the operations used are linear, and as a result commutative: one skilled in the art could rearrange them appropriately. In order to clearly explain the invention, however, this method describes them in a fixed sequence.

The PIF filter is now complete, and can be applied to an audio signal either off line or in real time. Applying it in real-time can be a challenge, because this filter is much longer than most FIR filters used in the professional audio industry. A real time processing algorithm developed by Meyer Sound called SCaRF (Spectral Convolution and Real-time Filtering) convolves real-time signals with very long FIR filters. The basic idea behind SCaRF is the observation that CPU architectures cannot compute long FIR filters efficiently because of how their memory is structured. Memory in modern CPUs consists of a large amount of slow main memory and a small amount of fast cache memory, or random access memory. The cache memory is too small to implement long FIRs in real-time, and the main memory is too slow. However, the cache architecture is naturally suited to the butterfly patterns in the Fast Fourier Transform (FFT): modern CPUs can attain almost peak DSP throughput when calculating FFTs, even with long lengths. SCaRF takes advantage of this to perform real-time filtering in the frequency domain. First, the FFT of the PIF and the input audio samples are taken. Since convolution of an FIR filter in the time domain is equivalent to multiplication in the frequency domain, the FFT of the PIF is multiplied by the FFT of the audio samples. The inverse Fourier transform is performed to obtain an audio stream that is now filtered by the PIF.

The complete system is now ready: the PIF filter is applied to the loudspeaker system in real time using the FFT-based SCaRF algorithm, and the resulting frequency response is flat in both frequency and phase.

While the invention has been described in considerable detail in the forgoing specification and accompanying drawings, it is not intended that the invention be limited to such detail, except as necessitated by the following claims.

What we claim is:

1. A method of creating a digital filter for correcting phase distortion produced at low frequencies in a loudspeaker system having a transducer driven by a piston with mass, comprising:

a. obtaining the complex-valued frequency response of the loudspeaker system, said frequency response including a magnitude component (the magnitude response) and a phase component (the phase response), and having a number of data points for producing a relatively high resolution representation of the frequency response of the loudspeaker system, said frequency response being set to zero above a high frequency cut-off point to create a high frequency blanked phase trace, b. inverting, by a processor, the phase response obtained in step (a) by taking the complex conjugate of the phase response to produce an inverted phase response, c. obtaining the impulse response for the inverted phase response by means of an inverse Fourier transform of the inverted phase response, wherein said impulse response is a symmetric linear phase FIR filter having a long filter length that depends on a low frequency cut-off point that is selected and is characterized by a series of FIR coefficients, said cut-off point being located at a frequency below which the obtained phase response of the loudspeaker system begins to continuously move away from zero degrees, d. applying, by the processor, a symmetric window function to the symmetric linear phase FIR filter to force the FIR coefficients to decay to zero by the end of the FIR filter length, e. adding, by the processor, pre-correction to the windowed symmetric linear phase FIR filter to correct for magnitude attenuation introduced by step (d) at low frequencies, and f. applying, by the processor, the pre-corrected windowed FIR filter to the audio signal input to the loudspeaker system for which the frequency response was obtained in step (a).

2. The method of claim 1 wherein in step (a) the complex-valued frequency response of the loudspeaker system is measured under free-field conditions.

3. The method of claim 1 wherein a second stage smoothing function is applied to the phase response prior to inverting the phase response, thereby creating a smooth polynomial approximation of the high frequency blanked phase response.

4. The method of claim 3 wherein said second stage smoothing function is a least-square smoothing spline algorithm applied to the high frequency blanked phase response.

5. The method of claim 1 wherein a second stage smoothing function is applied to the phase response prior to inverting the phase response, thereby creating a smooth polynomial approximation of the phase response.

6. The method of claim 5 wherein said second stage smoothing function is a least-square smoothing spline algorithm applied to the phase response.

7. The method of claim 5 wherein, prior to applying a smoothing function, the phase response is interpolated on a logarithmic frequency scale so that the information per octave is constant across the operating range of the loudspeaker system.

8. A digital filter for correcting phase distortion produced at low frequencies in a loudspeaker system having a transducer driven by a piston with mass, said filter being created in accordance with the method of claim 1.

9. A filter for correcting phase distortion produced at low frequencies in a loudspeaker system, said filter being created in accordance with the method of claim 1, wherein the filter is applied to the audio signal in real time.

10. A filter for correcting phase distortion produced at low frequencies in a loudspeaker system, said filter being created in accordance with the method of claim 1, wherein the filter is applied to the audio signal off-line and placed on a storage medium prior to playback through the loudspeaker system.

* * * * *